(12) United States Patent
Wordelman

(10) Patent No.: US 6,169,460 B1
(45) Date of Patent: Jan. 2, 2001

(54) OSCILLATOR MODE SUPPRESSION CIRCUIT

(75) Inventor: James D. Wordelman, DeKalb, IL (US)

(73) Assignee: CTS Corporation, Elkhart, IN (US)

( * ) Notice: Under 35 U.S.C. 154(b), the term of this patent shall be extended for 0 days.

(21) Appl. No.: 09/396,859

(22) Filed: Sep. 15, 1999

(51) Int. Cl.⁷ .................................................. H03B 5/36
(52) U.S. Cl. ...................................... 331/116 R; 331/159
(58) Field of Search ........................... 331/116 R, 116 FE, 331/158, 159

(56) References Cited

U.S. PATENT DOCUMENTS

| | | | |
|---|---|---|---|
| 3,581,236 | * 5/1971 | Berman | 331/116 R |
| 3,916,344 | * 10/1975 | Enderby | 331/116 R |
| 4,378,532 | 3/1983 | Burgoon | 331/158 |
| 5,053,726 | 10/1991 | Christopher et al. | 331/34 |
| 5,361,045 | * 11/1994 | Beaussier et al. | 331/154 |

* cited by examiner

Primary Examiner—Siegfried H. Grimm
(74) Attorney, Agent, or Firm—Mark P. Bourgeois; Mark W. Borgman

(57) ABSTRACT

An oscillator circuit suppresses unwanted oscillation frequencies and allows oscillation in the selected frequency band. The circuit has less sensitivity to aging of components that cause a shift in operating frequency. The oscillator includes a first and second inverting amplifier that each have an input terminal and an output terminal. A crystal resonator is connected between the input terminal of the first amplifier and the output terminal of the second amplifier. A suppression trap is connected between the first and second amplifier for suppressing oscillation outside the desired range of frequencies. The trap includes a parallel tank circuit that is connected between the output terminal of the first amplifier and the input terminal of the second amplifier. A capacitor is connected between the input terminal of the second amplifier and a ground.

20 Claims, 3 Drawing Sheets

OSCILLATOR MODE SUPPRESSION CIRCUIT

BACKGROUND OF THE PREFERRED EMBODIMENT(S)

1. Field of the Preferred Embodiment(s)

This invention generally relates to ovenized crystal oscillators which provide a stable reference source or frequency in computers or other electronic equipment. Specifically, there is a circuit that is capable of suppressing unwanted oscillation frequencies and allowing oscillation in the selected frequency band. The circuit has less sensitivity to aging of components causing a shift in frequency.

2. Description of the Related Art

Various devices are well known for providing a reference frequency or source such devices are called oscillators. The oscillator typically has a quartz crystal or other resonator and also has electronic compensation circuitry to stabilize the output frequency. Ovenized oscillators heat the temperature sensitive portions of the oscillator which is isolated from the ambient to a uniform temperature to obtain a more stable output.

A resonator designed for one mode will have various other unwanted modes, which are near harmonic, near sub-harmonic or inharmonic. Any of these modes which have series resistance values near or below that of the desired mode could cause the oscillator to run at an undesired mode frequency instead of the desired mode frequency. These unwanted modes must be suppressed, so that no build up to any level in the oscillator will occur. For example, using a doubly rotated crystal, the desired frequency is the third harmonic or overtone. It is desired to suppress or trap out the unwanted modes above and below the third overtone. Unfortunately, there are unwanted modes approximately 10% above, 30% below and 67% below the desired third mode. To prevent or separate the undesired frequencies, various mode suppression circuits have been developed. Some of these are resonant traps to suppress each unwanted frequency, low pass traps to suppress frequencies below the desired frequency, high pass traps to suppress frequencies above the desired frequency. Each of these approaches have various problems. The resonant trap approach for each unwanted frequency requires a separate trap for each unwanted frequency which needs a large number of parts and increases the circuit cost. The low pass and high pass suppression traps, while needing fewer parts, require more precise tolerance values on the capacitors, inductors and resistors in the trap circuit to maintain a precision oscillator frequency. Often the desired modes are very close to the undesirable modes (<10%). This close proximity causes the oscillator to have high frequency sensitivity to changes in the mode suppression circuit component values. This high sensitivity can result in poor frequency aging of the oscillator, especially due to inductor changes over time.

In oscillators of Pierce or Colpitts design, it is known that the circuit of the feedback path should be such that the phase of the feedback signal is −180 degrees. When the resonator has strong undesired modes nearby this −180 degrees should occur only for a band of frequencies that includes the desired mode. This approach allows unwanted oscillation modes above and below the desired oscillation frequency to be suppressed.

Despite the advantages of the prior art oscillators, there is a need for an oscillator mode suppression circuit that uses fewer components and that has fewer problems due to components aging over time.

Description of Incorporated Art

Examples of patents related to the present invention are as follows, wherein each patent is herein incorporated by reference for related and supporting teachings:

U.S. Pat. No. 4,378,532, is an oscillator mode suppression apparatus having bandpass effect.

U.S. Pat. No. 5,053,726, is a circuit for preventing vcxo mode jumping.

The foregoing patents reflect the state of the art of which the applicant is aware and are tendered with the view toward discharging applicants' acknowledged duty of candor in disclosing information that may be pertinent in the examination of this application. It is respectfully stipulated, however, that none of these patents teach or render obvious, singly or when considered in combination, applicants' claimed invention.

SUMMARY OF THE PREFERRED EMBODIMENT(S)

It is a feature of the invention to provide an oscillator circuit that is capable of suppressing unwanted oscillation frequencies and allowing oscillation in the selected frequency band. The circuit has less sensitivity to aging of components causing a shift in frequency.

A further feature of the invention is to provide an oscillator operable to oscillate on a desired range of frequencies. The oscillator includes a first and second inverting amplifier that each have an input terminal and an output terminal. The first inverting amplifier has a high input and low output impedance, while the second inverting amplifier has high input and output impedances. A crystal resonator in a pi-network is connected between the input terminal of the first amplifier and the output terminal of the second amplifier. A 2 port LC suppression trap is connected between the first and second amplifier for suppressing oscillation outside the desired range of frequencies. The trap includes a parallel tank circuit that is connected between the output terminal of the first amplifier and the input terminal of the second amplifier. A capacitor is connected between the input terminal of the second amplifier and a ground.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention. Further, the abstract is neither intended to define the invention of the application, which is measured by the claims, neither is it intended to be limiting as to the scope of the invention in any way.

BRIEF DESCRIPTION OF THE DRAWINGS

These and other features of the invention can best be understood by the following description of the accompanying drawings as follows.

It is noted that the drawings of the invention are not to scale. The drawings are merely schematic representations, not intended to portray specific parameters of the invention.

The drawings are intended to depict only typical embodiments of the invention, and therefore should not be considered as limiting the scope of the invention. The invention will be described with additional specificity and detail through the accompanying drawings.

DETAILED DESCRIPTION OF THE PREFERRED EMBODIMENT

Figure 1:
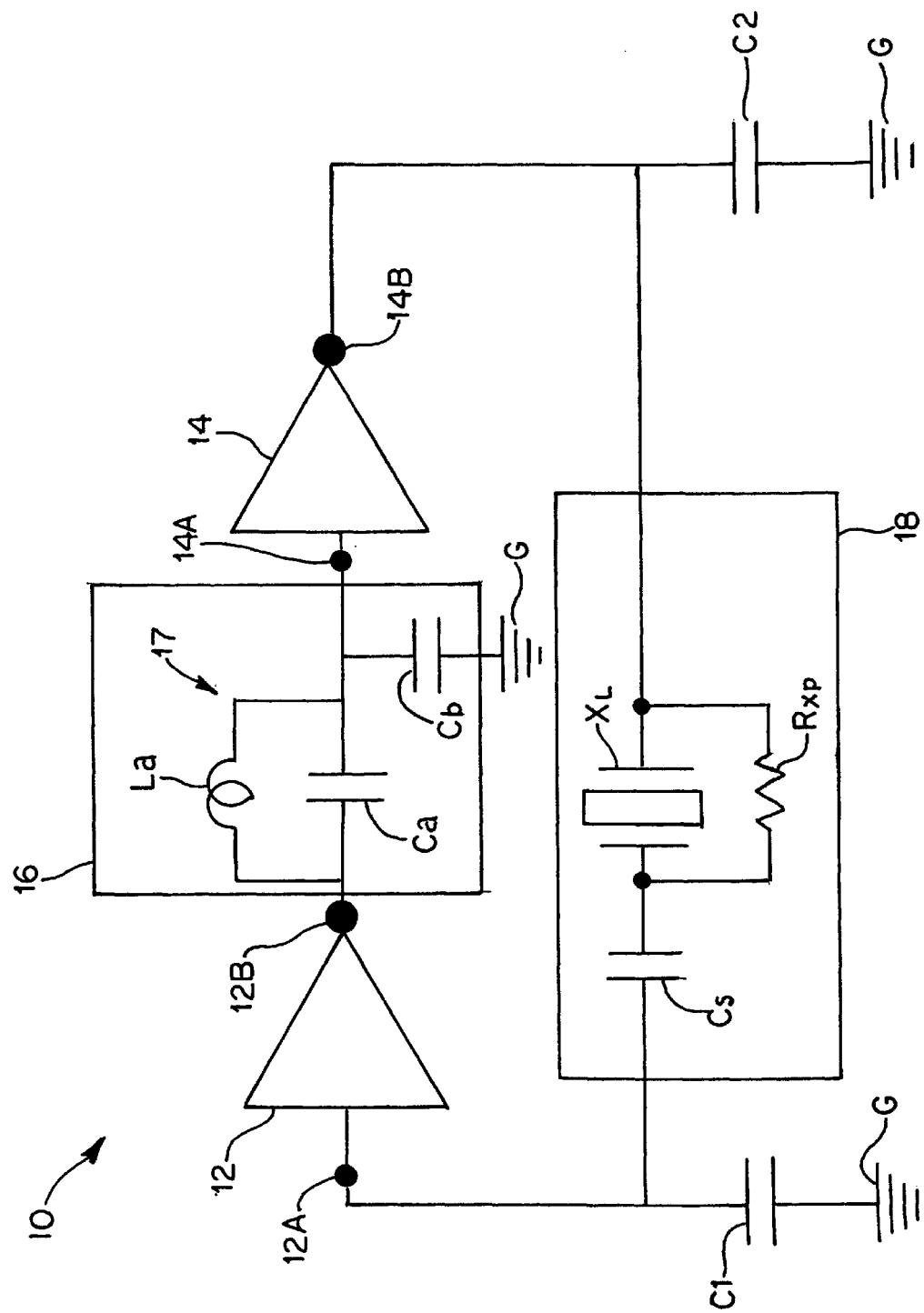
FIG. 1 is a schematic view of the preferred embodiment of the invention.

Referring to FIG. 1, a schematic view of an oscillator in a pi-network configuration is shown. Oscillator assembly or pi-network 10 includes a first inverting amplifier 12 having input terminal 12A and output terminal 12B and a second inverting amplifier 14 having input terminal 14A and output terminal 14B. A trap 16 is connected between the output terminal 12B of the first amplifier 12 and the input terminal 14A of the second inverting amplifier 14. Trap 16 has a tank circuit 17 comprised of a parallel connected inductor La and capacitor Ca. Series connected to the tank circuit is an end of a capacitor Cb. The other end of capacitor Cb is connected to ground. The tank circuit 17 combination of capacitor Ca and inductor La sets the high side suppression frequency of f2. Tank circuit 17 suppresses frequencies f2 and above frequencies. The tank circuit resonates with capacitor Cb to form the low side suppression frequency f1. Tank circuit 17 with capacitor Cb suppresses frequency of f2 and above as well as f1 and below. The frequency band between f1 to f2 could be called the enable band. Together capacitors Ca, Cb, and inductor La form a band suppression trap 16. It is noted that the trap 16 is actively isolated from the rest of oscillator 10.

A resonator 18 is connected between terminals 12A and 14B. Resonator 18 is a conventional resonator such as an SC cut quartz crystal XL. Resonator 18 also has a resistor Rxp connected across crystal XL to prevent static electrical potentials and a variable capacitor or varactor Cs series connected to crystal XL. Capacitor Cs is used to set the frequency of oscillation during or after manufacturing. Resistor Rxp has a very high value typically on the order of 5 megohms. A capacitor C1 is connected between terminal 12A and ground. Capacitor C2 is connected between terminal 14B and ground. These components would be mounted to a conventional printed circuit board or ceramic substrate, (not shown).

Figure 2:
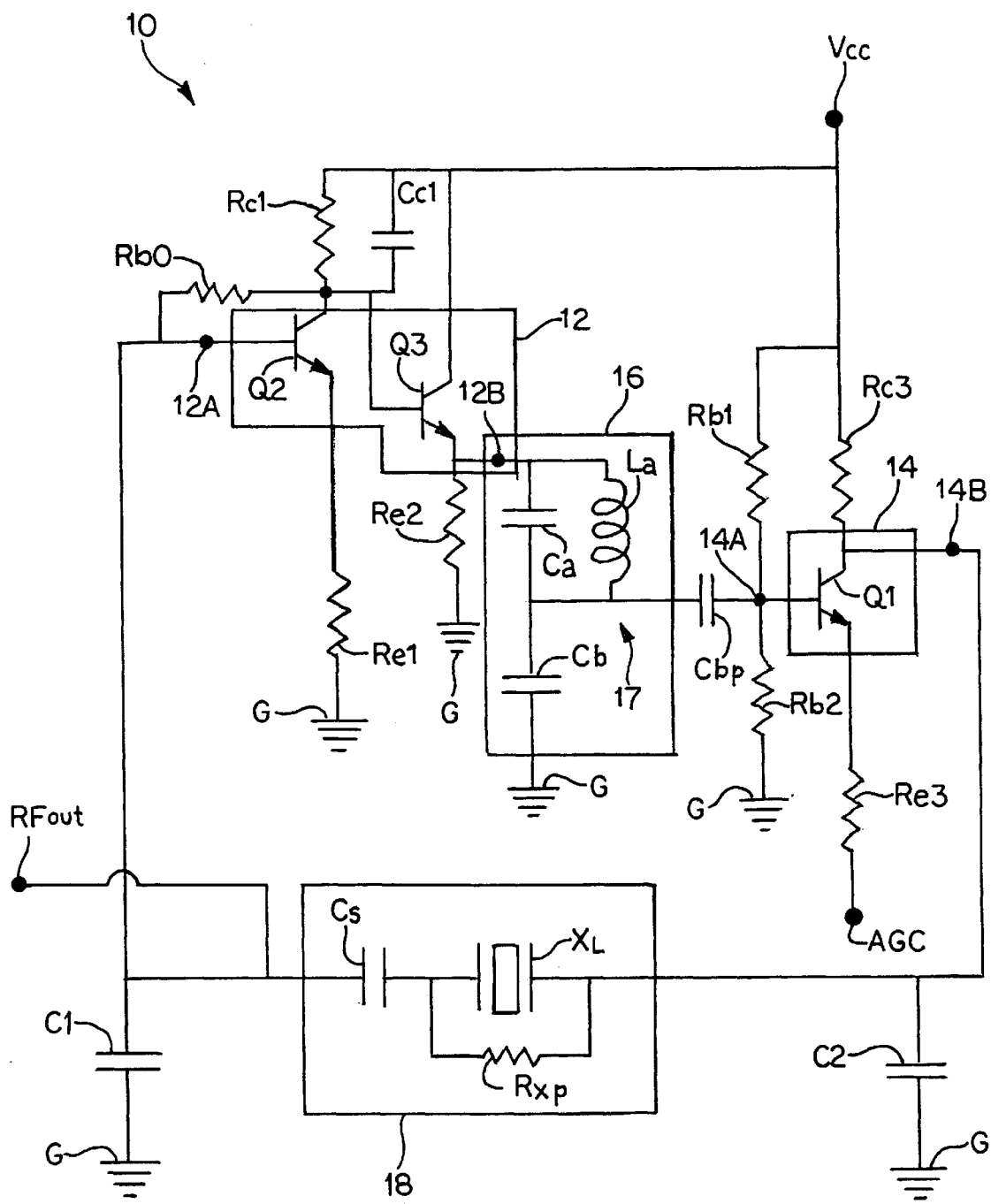
FIG. 2 is a more detailed view of the preferred embodiment of FIG. 1.

FIG. 2 shows a more detailed implementation of the oscillator circuit 10 of FIG. 1. Oscillator assembly 10 includes a first inverting amplifier 12 that has a pair of conventional NPN transistors Q2 and Q3 connected. The collector of Q2 is connected to the base of Q3. Q3 lowers the output impedance. A resistor Rc1 is connected between the collector of Q2 and a five volt voltage source Vcc. A capacitor Cc1 is connected between the collector of Q2 and voltage source Vcc. Capacitor Cc1 and Resistor Rc1 cause up to a 20 degree phase shift in the oscillator signal to complete one of the 180 degree phase shifts. A resistor Rbo is connected between the collector of Q2 and the base of Q2. A resistor Re1 is connected between the emitter of Q2 and ground G. Resistor Re1 controls the current to the amplifier. A resistor Re2 is connected between the emitter of transistor Q3 and ground. Second inverting amplifier 14 has a conventional NPN transistor Q1. A resistor Rc3 is connected between the collector of Q1 and a five volt voltage source Vcc. A resistor Rb1 is connected between the base of Q1 and Vcc. A resistor Re3 is connected between the emitter of Q1 and a variable DC voltage source called AGC which stands for automatic gain compensation. A resistor Rb2 is connected between the base of transistor Q1 and ground G. A DC blocking capacitor Cbp is connected between one end of inductor La and the base of transistor Q1.

The trap 16 has tank circuit 17 comprised of a parallel connected inductor La and capacitor Ca. The input terminal 12A is the base of transistor Q2, and the output terminal 12B is the emitter of transistor Q3 and is connected to the tank circuit. The input terminal 14A is the base of transistor Q1. The trap has the common node of Ca, Cb and La connected to base of transistor Q1. An output terminal RF out is connected between capacitors Cs and C1.

An oscillator using circuit 10 and designed to oscillate at 10 megahertz in the third overtone would have typical values as follows:

| La  | 1 uh       |
|-----|------------|
| Ca  | 200 pf     |
| Cb  | 100 pf     |
| Rxp | 5 Mohm     |
| Cs  | 30–1000 pf |
| C1  | 200 pf     |
| C2  | 250 pf     |

Oscillator assembly 10 would be assembled using conventional electronic manufacturing techniques.

Remarks on the Preferred Embodiment(s)

Inductors are susceptible to aging over time. As the inductor is used the magnetic field properties can change over time resulting in an inductance change. This change results in a change in the operating frequency of the prior art oscillators, since they are directly in the pi-network loop. The oscillator circuit 10 of the present invention uses an actively isolated mode suppression trap 16 to lower the sensitivity of the inductor La's change over time. Since the trap is actively isolated from the pi-network, a reactance change due to inductor aging cannot directly shift the loop resonant frequency. The only effect a change in reactance can have is to change the phase and magnitude of the amplifier circuit signal. The change in magnitude is compensated for by the automatic gain compensator (AGC). The phase change has more effect on frequency and therefore is an important consideration. However, by selecting the band-enable window at the center of the high and low frequencies f1 and f2, the phase slope versus frequency curve is in the very low to zero range. In other words, with a trap designed in this manner and actively isolated, there will be no effect on the oscillator frequency because of inductor aging.

Figure 3:
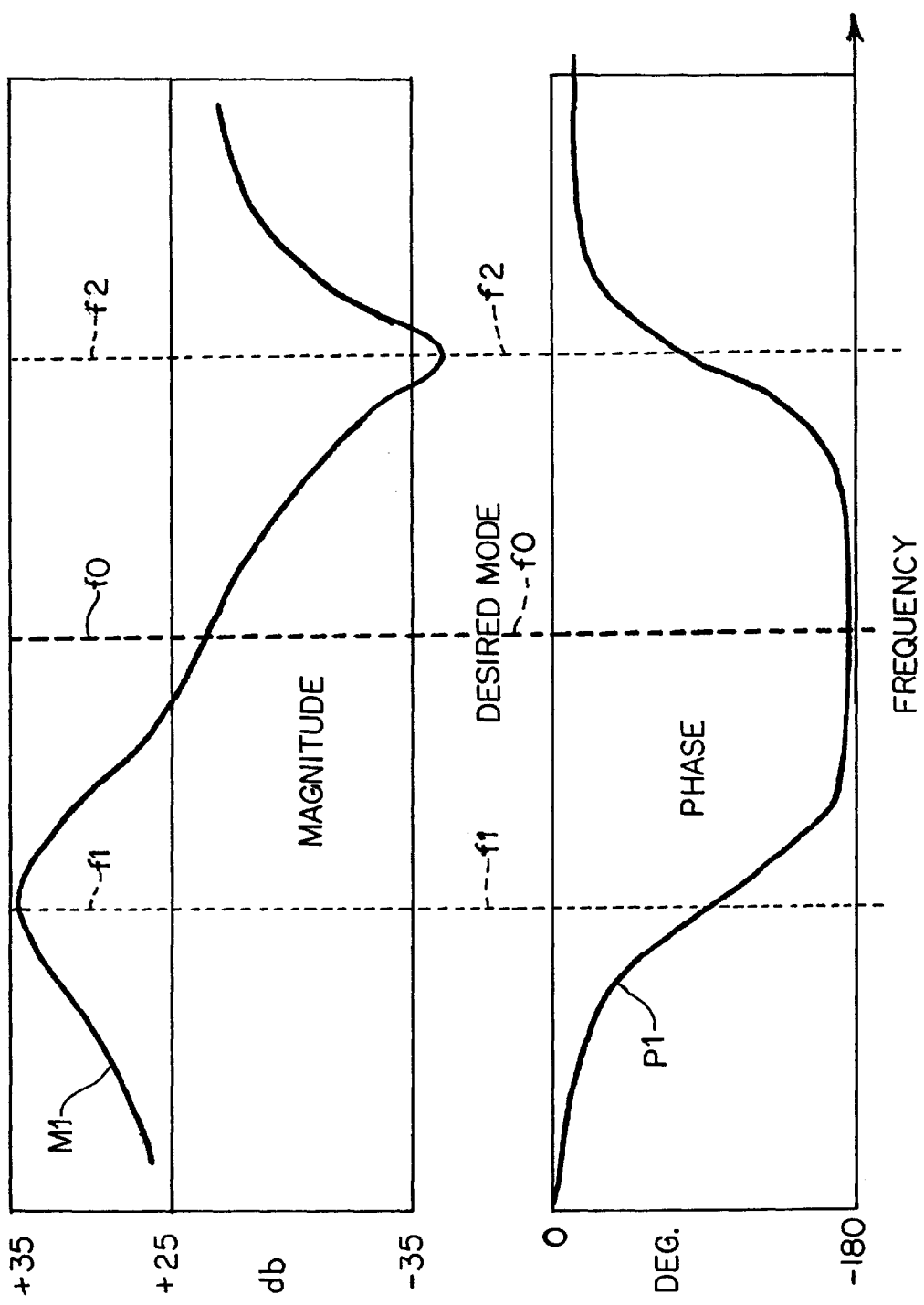
FIG. 3 is a transmission response of the trap and amplifiers of FIG. 1 with the crystal and pi-network removed.

FIG. 3 shows a representative magnitude and phase versus frequency signals M1 and P1 of the amplifier and trap portions of the oscillator. A peak in the magnitude response occurs at the lower frequency f1 and a notch occurs at the higher frequency f2. The frequency f2 is placed above the desired mode at the frequency of the undesired mode, which is to be suppressed. The frequency f1 is placed below the desired mode such that the desired mode is approximately half way between them. This is the point where the phase slope is zero.

It should also be noted that the suppression trap 16 of the present invention requires only one high quality inductor La. Therefore, the circuit can be structured at a lower cost using fewer components that are susceptible to aging problems over time.

During operation, the circuit 10 causes the signal to change phase several times. Trap 16 causes the signal to change phase approximately −170 degrees. Second amplifier 14 causes the signal to change phase approximately −180 degrees. First amplifier 12 causes the signal to change phase approximately −190 degrees. The overall effect is that circuit 10 causes the frequency of the oscillator signal to change −180 degrees. First amplifier 12 has approximately −10 degrees of phase shift added by the combination of Capacitor Cc1 and Resistor Rc1.

Variations of the Preferred Embodiment(s)

One of ordinary skill in the arts of oscillator design, will realize many advantages from using the preferred embodiment. Further, one of ordinary skill in the art of making oscillators will realize that there are many different ways of accomplishing the preferred embodiment. For example, it was shown that an SC cut crystal XI was used. It is contemplated that the circuit 10 could be used with other crystal resonators XL such as SAW devices, AT cut crystals or inverted mesa crystals.

Even though the embodiment discusses the use of transistors Q1, Q2 and Q3 for amplifiers, one skilled in the art would realize that other components could be used such as op-amps, or logic gates.

Although, the actively isolated trap 16 was illustrated as being used in an overtone oscillator, it is contemplated to use trap 16 in a fundamental mode oscillator or in a Butler circuit configuration.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An oscillator operable to oscillate on a desired range of frequencies, comprising:
   a) a first and second inverting amplifier each having an input terminal and an output terminal;
   b) a crystal resonator connected between the input terminal of the first amplifier and the output terminal of the second amplifier; and
   c) trap means, connected between the first and second amplifier for suppressing oscillation outside the desired range of frequencies.

2. The oscillator according to claim 1, wherein the trap means comprises:
   a) a parallel tank circuit connected between the output terminal of the first amplifier and the input terminal of the second amplifier; and
   b) a capacitor connected between the input terminal of the second amplifier and a ground.

3. The oscillator according to claim 2, wherein the trap means is actively isolated from the resonator.

4. The oscillator according to claim 2, wherein the parallel tank circuit has at least one inductor and at least one capacitor.

5. The oscillator according to claim 4, wherein changes in an inductance value of the inductor over time have a negligible effect on the frequencies suppressed by the trap means.

6. The oscillator according to claim 1, wherein the first and second amplifier means, the trap means, and the crystal resonator each provide approximately a −180 degree phase shift in the desired band of frequencies.

7. The oscillator according to claim 1, wherein a phase shift means is connected between the first amplifier and a voltage source.

8. The oscillator according to claim 7, wherein the phase shift means is a parallel connected capacitor and resistor.

9. The oscillator according to claim 7, wherein the phase shift means shifts frequency up to −20 degrees.

10. A pi-network oscillator operable to oscillate on a desired range of frequencies, comprising:
    a) a pi-network including:
       1) a first and second inverting amplifier each having an input terminal and an output terminal;
       2) resonator means, connected between the input terminal of the first amplifier and the output terminal of the second amplifier, for generating a stable frequency signal; and
       3) trap means, actively isolated from the pi-network and connected between the first and second amplifier for suppressing oscillation outside the desired range of frequencies.

11. The oscillator according to claim 10, wherein the trap means comprises:
    a) a parallel tank circuit connected between the output terminal of the first amplifier and the input terminal of the second amplifier, and
    b) a capacitor connected between the input terminal of the second amplifier and a ground.

12. The oscillator according to claim 11, wherein the resonator means is a crystal.

13. The oscillator according to claim 11, wherein the parallel tank circuit has at least one inductor and at least one capacitor.

14. The oscillator according to claim 13, wherein changes in an inductance value of the inductor over time have a negligible effect on the frequencies suppressed by the trap means.

15. The oscillator according to claim 10, wherein the first and second amplifiers, the trap means and the resonator means each provide a −180 degree phase shift in the desired band of frequencies.

16. The oscillator according to claim 10, wherein a phase shift means is connected between the first amplifier and a voltage source.

17. The oscillator according to claim 16, wherein the phase shift means is a parallel connected capacitor and resistor.

18. The oscillator according to claim 16, wherein the phase shift means shifts frequency up to −20 degrees.

19. An oscillator operable to oscillate on a desired range of frequencies, comprising:
    a) a first and second series connected inverting amplifier;
    b) a crystal resonator connected across the first amplifier and the second amplifier; and
    c) a trap, connected between the first and second amplifier, for suppressing oscillation outside the desired range of frequencies.

20. The oscillator according to claim 1, wherein the trap comprises:
    a) a parallel tank circuit; and
    b) a capacitor connected between the tank circuit and a ground.

* * * * *